(12) United States Patent
Noguchi et al.

(10) Patent No.: US 10,697,089 B2
(45) Date of Patent: Jun. 30, 2020

(54) EPITAXIAL SUBSTRATE

(71) Applicants: PANASONIC CORPORATION, Osaka (JP); RIKEN, Saitama (JP)

(72) Inventors: Norimichi Noguchi, Osaka (JP); Takuya Mino, Osaka (JP); Takayoshi Takano, Osaka (JP); Jun Sakai, Osaka (JP); Hitomichi Takano, Osaka (JP); Kenji Tsubaki, Osaka (JP); Hideki Hirayama, Saitama (JP)

(73) Assignees: PANASONIC CORPORATION, Osaka (JP); RIKEN, Saitama (JP)

(*) Notice: Subject to any disclaimer, the term of this patent is extended or adjusted under 35 U.S.C. 154(b) by 0 days.

(21) Appl. No.: 16/073,850

(22) PCT Filed: Nov. 1, 2016

(86) PCT No.: PCT/JP2016/004777
§ 371 (c)(1),
(2) Date: Jul. 30, 2018

(87) PCT Pub. No.: WO2017/134708
PCT Pub. Date: Aug. 10, 2017

(65) Prior Publication Data
US 2019/0040546 A1 Feb. 7, 2019

(30) Foreign Application Priority Data
Feb. 1, 2016 (JP) ................. 2016-016985

(51) Int. Cl.
*C30B 29/40* (2006.01)
*C23C 16/34* (2006.01)
(Continued)

(52) U.S. Cl.
CPC ............. *C30B 29/403* (2013.01); *C23C 16/34* (2013.01); *C30B 25/18* (2013.01); *C30B 29/38* (2013.01);
(Continued)

(58) Field of Classification Search
CPC ........ C30B 29/403; C30B 29/68; H01L 33/22; H01L 33/0075; B32B 3/30; Y10T 428/24612
See application file for complete search history.

(56) References Cited

U.S. PATENT DOCUMENTS

2009/0057646 A1* 3/2009 Hirayama ........... H01L 21/0237
257/13
2015/0372190 A1 12/2015 Hirayama

FOREIGN PATENT DOCUMENTS

JP 2009-155141 7/2009
JP 2011-175997 9/2011
(Continued)

OTHER PUBLICATIONS

Machine translation of applicant cited JP 2011-175997, (Year: 2011).*
(Continued)

*Primary Examiner* — Donald J Loney
(74) *Attorney, Agent, or Firm* — Greenblum & Bernstein, P.L.C.

(57) ABSTRACT

An epitaxial substrate includes: a single crystal substrate including projections arranged in an array on a plane. Each projection has a conical or pyramidal shape tapered in a normal direction to the plane. The AlN layer includes: a first AlN crystal covering the plane and the projections with tips of the projections being exposed; second AlN crystals protruding from the tips of the projections along the normal direction and each having a shape of a column whose
(Continued)

cross-sectional area increases as a distance from a tip of a corresponding projection increases; and a third AlN crystal as a layer interconnecting ends of the second AlN crystals, opposite the single crystal substrate.

4 Claims, 7 Drawing Sheets

(51) Int. Cl.
    *C30B 25/18*     (2006.01)
    *H01L 21/205*     (2006.01)
    *H01L 21/20*     (2006.01)
    *H01L 33/22*     (2010.01)
    *C30B 29/38*     (2006.01)
    *H01L 21/02*     (2006.01)
    *C30B 29/68*     (2006.01)
    *B32B 3/30*     (2006.01)
    *H01L 33/00*     (2010.01)

(52) U.S. Cl.
    CPC .......... *C30B 29/68* (2013.01); *H01L 21/0242* (2013.01); *H01L 21/0243* (2013.01); *H01L 21/0254* (2013.01); *H01L 21/0262* (2013.01); *H01L 21/02458* (2013.01); *H01L 21/02502* (2013.01); *H01L 21/02513* (2013.01); *H01L 21/20* (2013.01); *H01L 21/205* (2013.01); *H01L 33/22* (2013.01); *B32B 3/30* (2013.01); *H01L 21/02389* (2013.01); *H01L 33/0075* (2013.01); *Y10T 428/24612* (2015.01)

(56) References Cited

FOREIGN PATENT DOCUMENTS

| | | |
|---|---|---|
| JP | 2013-191665 | 9/2013 |
| KR | 2013-0072825 | 7/2013 |
| WO | 2014/069235 | 5/2014 |
| WO | 2014/136393 | 9/2014 |

OTHER PUBLICATIONS

Official Communication issued in European Patent Office (EPO) Patent Application No. 16889199.2, dated Jan. 4, 2019.
Dong et al., "282-nm AlGaN-based deep ultraviolet light-emitting diodes with improved performance on nano-patterned sapphire substrates", Applied Physics Letters 102, 241113, 2013, pp. 1-4.
International Search Report issued in International Bureau of WIPO Patent Application No. PCT/JP2016/004777, dated Dec. 6, 2016.

* cited by examiner

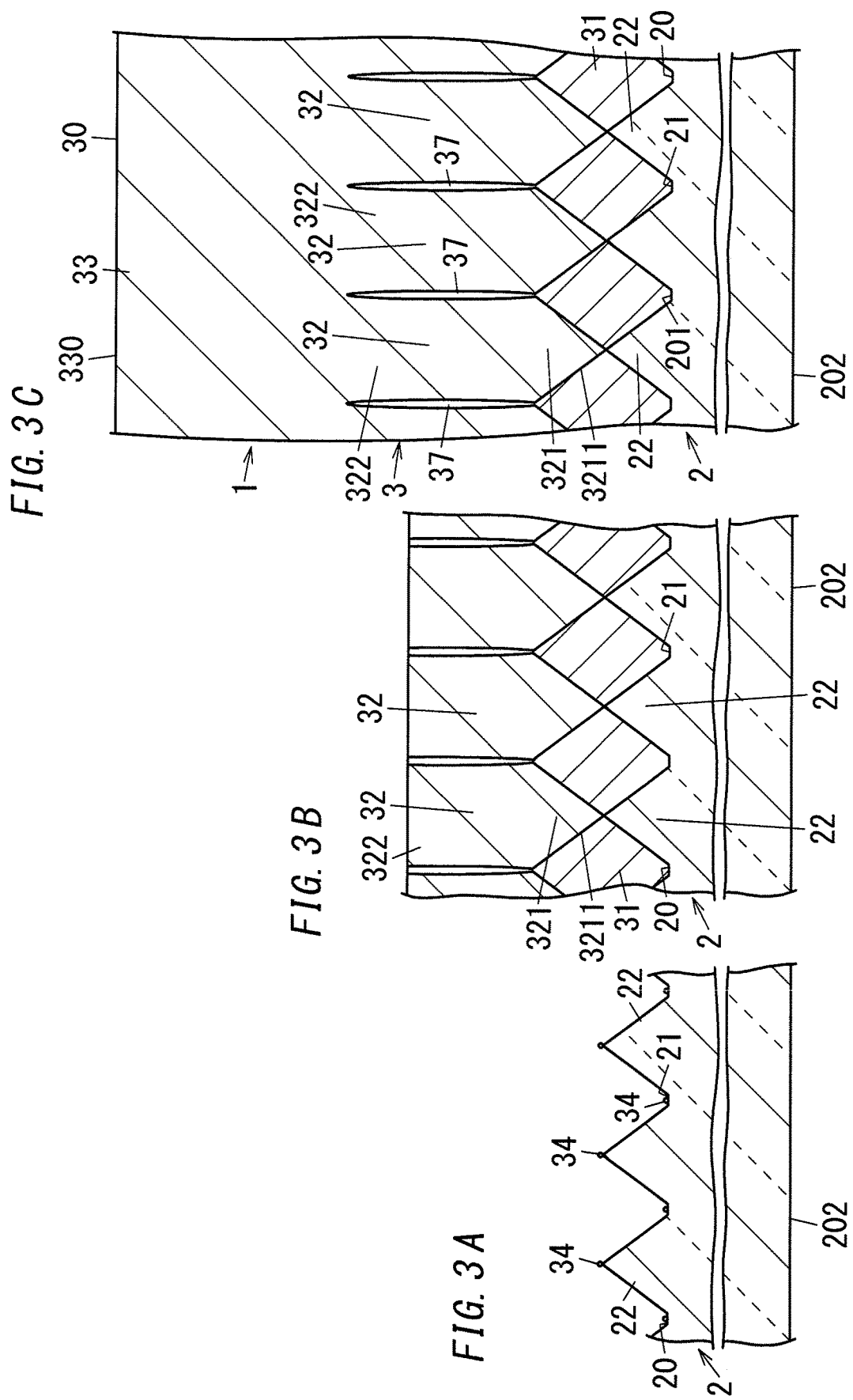

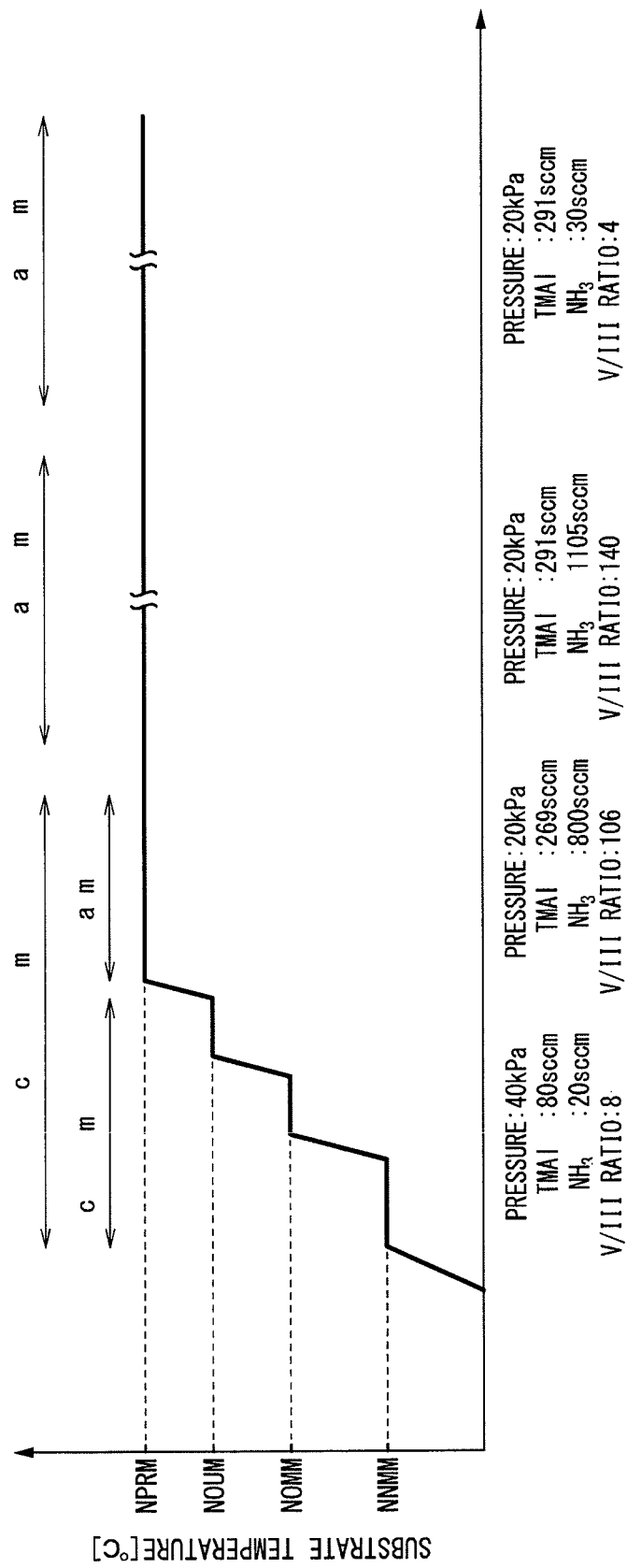

EPITAXIAL SUBSTRATE

TECHNICAL FIELD

The present invention relates to an epitaxial substrate.

BACKGROUND ART

A sapphire substrate having micro unevenness is known as a crystal growth substrate adopted for light-emitting diodes (see, for example, Non-Patent Literature 1).

Non-Patent Literature 1 describes a nano-patterned sapphire substrate (NPSS) as a sapphire substrate having micro unevenness. Non-Patent Literature 1 further describes an epitaxial substrate including the NPSS and AlN grown on the NPSS. Patterns on a surface of the NPSS are a plurality of concave triangle cones formed by etching a sapphire crystal. The surface of the NPSS includes inner surfaces of the plurality of concave triangle cones and surfaces (planar parts) of unetched portions of the sapphire crystal. Non-Patent Literature 1 describes that growing AlN on the NPSS enables the dislocation density in the AlN to be reduced. However, the epitaxial substrate described in Non-Patent Literature 1 still has a high dislocation density. Thus, for example, to increase the efficiency of ultraviolet light-emitting diodes, further reducing dislocations in the epitaxial substrate is desirable.

In the field of epitaxial substrates, further reducing the dislocation density in an MN layer is desirable to improve crystallinity.

CITATION LIST

Patent Literature

Non-Patent Literature 1: Peng Dong, et al, "282-nm AlGaN-based deep ultraviolet light-emitting diodes with improved performance on nano-patterned sapphire substrates", APPLIED PHYSICS LETTERS 102, 241113 (2013)

SUMMARY OF INVENTION

One of the objectives of the present disclosure is to provide an epitaxial substrate which enables crystallinity to be further improved.

An epitaxial substrate of one aspect according to the present invention includes: a single crystal substrate including a plurality of projections with the plurality of projections protruding from a plane in a normal direction to the plane and arranged in a two-dimensional array; and an AlN layer on the plane of the single crystal substrate. Each of the plurality of projections has a conical or pyramidal shape tapered in the normal direction. The AlN layer includes a first AlN crystal, a plurality of second AlN crystals, and a third AlN crystal. The first AlN crystal covers the plane and the plurality of projections with tips of the plurality of projections being exposed. The plurality of second AlN crystals protrude from the tips of the plurality of projections along the normal direction. Each second MN crystal has a shape of a column whose cross-sectional area increases as a distance from a tip of an associated one of the plurality of projections increases. The third AlN crystal is formed as a layer interconnecting ends of the plurality of second AlN crystals. The ends are located opposite the single crystal substrate.

BRIEF DESCRIPTION OF DRAWINGS

FIG. 3A is a sectional view illustrating a first step which is a main step in a method for fabricating the epitaxial substrate, FIG. 3B is a sectional view illustrating a second step which is a main step in the method for fabricating the epitaxial substrate, and FIG. 3C is a sectional view illustrating a third step which is a main step in the method for fabricating the epitaxial substrate;

FIG. 4 is a sequence diagram illustrating growth of an AlN layer of an epitaxial substrate according to an example of the present invention;

DESCRIPTION OF EMBODIMENT

The inventors of the present invention investigated the relationship among the surface profile of a single crystal substrate having micro unevenness, conditions of crystal growth of an AlN layer on the single crystal substrate, and the crystallinity of the AlN layer formed on the single crystal substrate through the crystal growth based on results of experiments conducted by the inventors of the present invention. As a result, the inventors of the present invention found that when to fabricate an epitaxial substrate, a single crystal substrate including a plurality of projections with the plurality of projections protruding from a plane in a normal direction to the plane is used as a crystal growth substrate, and an AlN layer has a certain structure, the AlN layer has good crystallinity with reduced dislocation density. Specifically, the inventors of the present invention found a growth condition of an AlN layer, having better crystallinity than a conventional one, on a single crystal substrate including a plurality of conical projections protruding from a plane in a normal direction to the plane.

The present embodiment relates to an epitaxial substrate, and specifically, to an epitaxial substrate having the structure of epitaxial growth of an AlN layer on a single crystal substrate.

Figure 1:
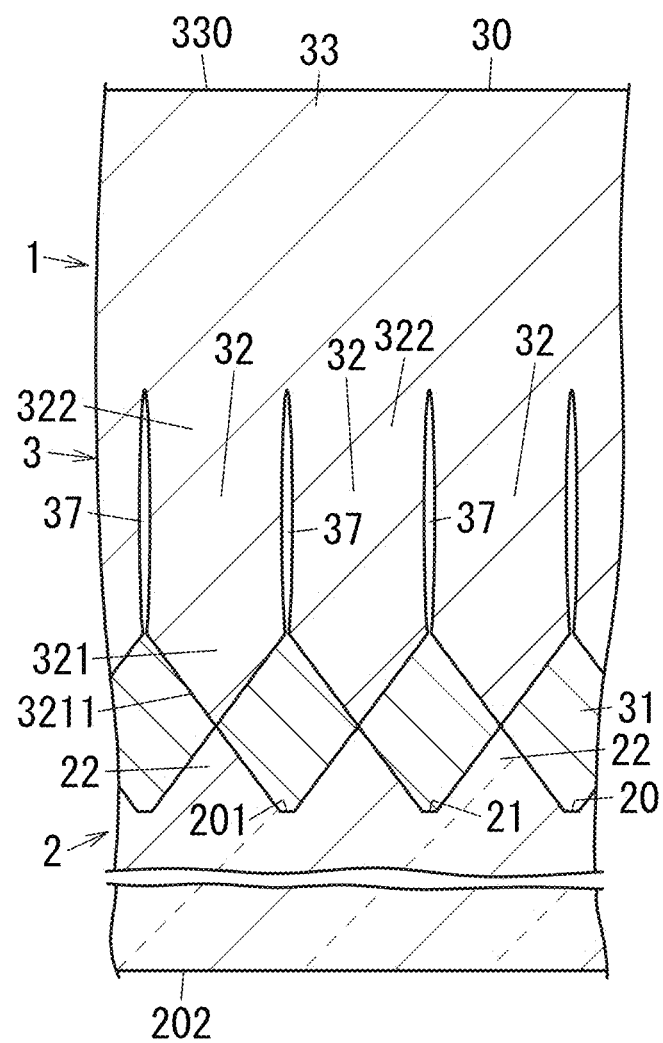
FIG. 1 is a sectional view schematically illustrating an epitaxial substrate according to an embodiment of the present invention.

FIGS. 1 to 3 which are referred to in the embodiment described below are schematic views, and ratios of the sizes and the thicknesses of components in these figures do not necessarily correspond to their actual dimensional ratios.

In the following description, an epitaxial substrate 1 of the present embodiment will be described with reference to FIGS. 1 and 2.

The epitaxial substrate 1 of the present embodiment is a substrate having the structure of epitaxial growth of an AlN layer 3 on a single crystal substrate 2. Specifically, the epitaxial substrate 1 is a substrate formed by epitaxial growth of the AlN layer 3 on the single crystal substrate 2 through a metal organic vapor phase epitaxy (MOVPE) apparatus. In the epitaxial substrate 1, the plane orientation of a plane 21 of the single crystal substrate 2 is the same as the plane orientation of a surface 30 of the AlN layer 3, and the AlN layer 3 serves as an epitaxial layer. In the epitaxial substrate 1, for example, the plane 21 of the single crystal substrate 2 is the (0001) plane, and the surface 30 of the AlN layer 3 is the (0001) plane. In this embodiment, "the plane 21 of the single crystal substrate 2" is one plane of two planes orthogonal to a thickness direction of the single crystal substrate 2, the one plane lying under the AlN layer 3. In this embodiment, "one plane of two planes which lies under the AlN layer 3" does not include surfaces of a plurality of projections 22. The surface 30 of the AlN layer 3 serving as the (0001) plane can be confirmed by, for example, X-ray diffraction, an image of electron diffraction by TEM, or the like. The surface 30 of the AlN layer 3 is an Al polar plane. The size of the epitaxial substrate 1 may be, for example, a chip size or a wafer size.

The epitaxial substrate 1 of the present embodiment includes: the single crystal substrate 2 including the plurality of projections 22, with the plurality of projections 22 protruding from the plane 21 in a normal direction to the plane 21 and arranged in a two-dimensional array; and the AlN layer 3 on the plane 21 of the single crystal substrate 2. Each of the plurality of projections 22 has a conical or pyramidal shape tapered in the normal direction to the plane 21 of the single crystal substrate 2. The AlN layer 3 includes a first AlN crystal 31, a plurality of second AlN crystals 32, and a third AlN crystal 33. The first AlN crystal 31 covers the plane 21 and the plurality of projections 22 with tips of the plurality of projections 22 being exposed. The plurality of second AlN crystals 32 protrude from the tips of the plurality of projections 22 along the normal direction to the plane 21. Each second AlN crystal 32 has a shape of a column whose cross-sectional area increases as the distance from a tip of an associated one of the plurality of projections 22 increases. The third AlN crystal 33 is formed as a layer interconnecting ends 322 of the plurality of second AlN crystals 32. The ends 322 are located opposite the single crystal substrate 2. Thus, the epitaxial substrate 1 enables crystallinity to be further improved.

Moreover, in the epitaxial substrate 1, a hollow 37 is preferably provided between each adjacent two of the plurality of second AlN crystals 32. In other words, the plurality of second MN crystals 32 preferably protrude from the tips of the plurality of projections 22 along the normal direction to the plane 21 of the single crystal substrate 2 such that the second MN crystals 32 do not come into contact with each other. Thus, in the epitaxial substrate 1, a dislocation which occurs at an interface between each projection 22 and each second AlN crystal 32 extends from a vicinity of the tip of the projection 22 in a direction inclined relative to the normal direction to the single crystal substrate 2 is more likely to disappear at the hollows 37.

Components of the epitaxial substrate 1 will be described in detail below.

The single crystal substrate 2 of the epitaxial substrate 1 is a single crystal substrate having a hexagonal crystal structure. Specifically, the single crystal substrate 2 is a sapphire substrate. In this embodiment, the plane 21 of the single crystal substrate 2 is the c-plane of the sapphire substrate, that is, the (0001) plane. Thus, the normal direction to the plane 21 of the single crystal substrate 2 corresponds to the c-axis direction of crystal axis directions of the single crystal substrate 2. Moreover, the normal direction to the plane 21 of the single crystal substrate 2 is directed to one side in the thickness direction of the single crystal substrate 2. The distance between the plane 21 (first surface 201) of the single crystal substrate 2 and a second surface 202 opposite to the plane 21 is, for example, preferably about 100 μm to 1000 μm, more preferably about 120 μm to 800 μm, and more preferably about 150 μm to 500 μm. The off-angle of the plane 21 of the single crystal substrate 2 from the (0001) plane is preferably about 0° to 0.4°, and more preferably about 0.1° to 0.31°. In this embodiment, the term "off-angle" denotes an inclined angle of the plane 21 relative to the (0001) plane. Thus, when the off-angle is 0°, the plane 21 is the (0001) plane.

Figure 2A:
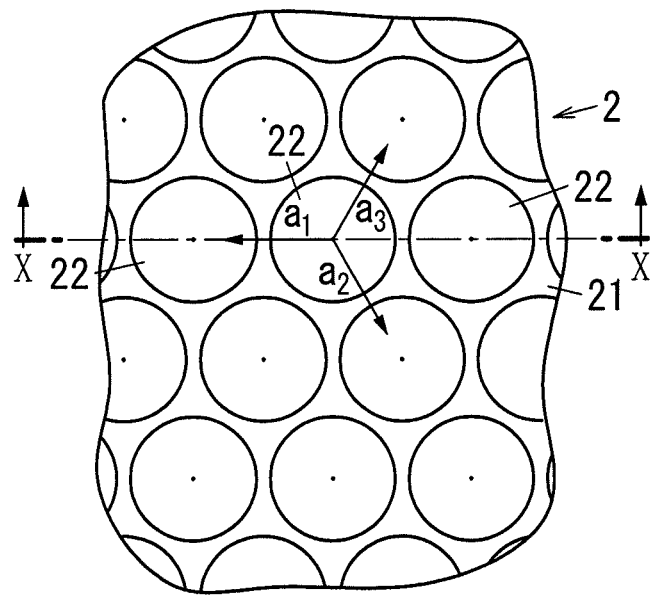
FIG. 2A is a plan view illustrating a single crystal substrate of the epitaxial substrate.
Figure 2B:
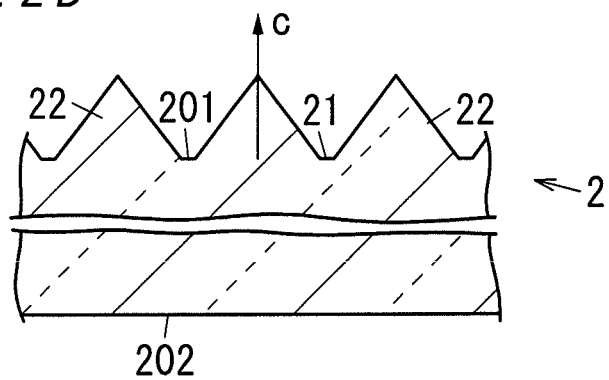
FIG. 2B is a sectional view taken along line X-X in FIG. 2A.

On the plane 21 of the single crystal substrate 2, the plurality of projections 22 protruding from the plane 21 in the normal direction to the plane 21 are arranged in a two-dimensional array. Each of the plurality of projections 22 is independently island-shaped. In other words, the plurality of projections 22 are formed as respective islands and are arranged in a two-dimensional array. The plurality of projections 22 are arranged at respective lattice points of a virtual triangular lattice. However, the arrangement of the projections is not limited to this example. For example, the plurality of projections may be arranged at respective lattice points of a virtual hexagonal lattice. The plurality of projections 22 preferably have the same size. In FIG. 2A, directions of the $a_1$, $a_2$, and $a_3$ axes of crystal axes of the single crystal substrate 2 are indicated by arrows. Moreover, in FIG. 2B, the direction of the c-axis of the crystal axes of the single crystal substrate 2 is indicated by an arrow. The $a_1$, $a_2$, and $a_3$ axes are orthogonal to the c axis. The $a_1$, and $a_3$ axes are 120° apart. The $a_1$, $a_2$, and $a_3$ axes may be shifted by 30° in the same direction, i.e., clockwise or counterclockwise, in FIG. 2A. That is, the $a_1$, $a_2$, and $a_3$ axes may be rotated by 30° about the c axis as a center shaft in the same direction, i.e., clockwise or counterclockwise, from their positions shown in FIG. 2A.

The single crystal substrate 2 integrally includes the plurality of projections 22. In other words, each of the plurality of projections 22 is a part of the single crystal substrate 2. In this embodiment, the sapphire substrate constituting the single crystal substrate 2 is a so-called patterned sapphire substrate (PSS). Each of the plurality of projections 22 has a conical shape tapered in the c-axis direction of the single crystal substrate 2. In this embodiment, when the off-angle is 0°, the c-axis direction of the single crystal substrate 2 is parallel to the normal direction to the plane 21 of the single crystal substrate 2. Thus, each of the plurality of projections 22 has a round cross section orthogonal to the normal direction to the plane 21 of the single crystal substrate 2. Each projection 22 preferably has a height of, for example, about 300 nm to 2000 nm. Each projection 22 has a bottom surface preferably having a diameter of, for example, 300 nm to 3000 nm. The conical or pyramidal shape excludes a truncated conical or pyramidal shape. Moreover, the generatrix of the conical shape is not necessarily a straight line but may be a curved line which is a nearly straight line. The distance between each adjacent projections 22 of the plurality of projections 22 is preferably, for example, about 50 nm to 1000 nm. Numerical values of the size of each projection 22 (the height, the diameter of the bottom surface, etc.) and the distance between two adjacent projections 22 are mere examples and are not particularly limited. Each of the plurality of projections 22 does not necessarily have a conical shape but may have, for example, a square-pyramidal shape.

The MN layer 3 of the epitaxial substrate 1 includes the plurality of second AlN crystals 32 and the third AlN crystal 33. The plurality of second AlN crystals 32 protrude from the tips of the plurality projections 22. Each second AlN crystal 32 has a columnar shape. The third AlN crystal 33 is formed as a layer connected to the ends 322 of the plurality of second AlN crystals 32. The ends 322 are located opposite the single crystal substrate 2.

The plurality of second AlN crystals 32 protrude from the tips of the plurality of projections 22 along the normal direction to the plane 21. That is, each of the plurality of second AlN crystals 32 protrudes in the c-axis direction from the tip of an associated one of the projections 22 which is located directly under each second AlN crystal 32. The plurality of second AlN crystals 32 are disposed at respective lattice points of a virtual triangular lattice in the same manner as the plurality of projections 22. Each second AlN crystal 32 has a shape of a column whose cross-sectional area increases as the distance from the tip of an associated one of the plurality of projections 22 increases. Each of the plurality of second AlN crystals 32 has a hexagonal prism shape. In this embodiment, each of the plurality of second AlN crystals 32 has an end 321 having a hexagonal pyramid shape. In each of the plurality of second AlN crystals 32, the cross-sectional area of the end 321 adjacent to the single crystal substrate 2 increases as the distance from the tip of an associated one of the plurality of projections 22 increases, and the cross-sectional area of portions other than the end 321 is almost constant. The cross-sectional area mentioned herein denotes an area of a cross section orthogonal to the normal direction to the plane 21. The shape of the cross section is hexagonal. The term "hexagonal" mentioned herein does not strictly refer to the shape of a "hexagon" but may mean "shaped like a hexagon". The plurality of second AlN crystals 32 are preferably arranged such that one side of one of respective hexagons of each two adjacent second AlN crystals 32 preferably faces one side of the other in a plane orthogonal to the normal direction to the plane 21 of the single crystal substrate 2. Thus, in the epitaxial substrate 1, the thickness of the third AlN crystal 33 can further be reduced. Each of the plurality of second AlN crystals 32 is an AlN single crystal epitaxially grown in the c-axis direction of the single crystal substrate 2.

The third AlN crystal 33 continues from the plurality of second AlN crystals 32. Two adjacent second AlN crystals 32 of the plurality of second AlN crystals 32 grow to be connected to (integrated with) each other and further grow to form a layer, thereby forming the third AlN crystal 33. The distance between the plane 21 of the single crystal substrate 2 and a location at which each two adjacent AlN crystals 32 are joined varies in a region of the third AlN crystal 33. The third AlN crystal 33 is an AlN single crystal epitaxially grown in the c-axis direction of the single crystal substrate 2. The surface 30 of the AlN layer 3 corresponds to a surface 330 of the third AlN crystal 33. In other words, in the epitaxial substrate 1, the surface 330 of the third AlN crystal 33 constitutes the surface 30 of the AlN layer 3. The thickness of the third AlN crystal 33 is preferably determined so as to planarize the surface 30 of the AlN layer 3. The thickness of the third AlN crystal 33 is preferably, for example, about 2 μm to 15 μm. The thickness of the third AlN crystal 33 is a thickness in the normal direction to the plane 21 of the single crystal substrate 2.

As described above, the AlN layer 3 includes the first AlN crystal 31 covering the plane 21 and the plurality of projections 22 of the single crystal substrate 2 with the tips of the plurality of projections 22 being exposed. The first AlN crystal 31 is disposed between the single crystal substrate 2 and side surfaces 3211 of the ends 321 of the plurality of second AlN crystals 32 adjacent to the single crystal substrate 2. From a result of observation of a cross-sectional TEM image of the epitaxial substrate 1, the first AlN crystal 31 is assumed to be an AlN crystal formed of layers of poly-crystalline AlN on top of each other. In the epitaxial substrate 1, the plurality of hollows 37 relieve tensile stress caused in the AlN layer 3 due to a difference between thermal expansion coefficients of the single crystal substrate 2 and the AlN layer 3, or the like. Thus, occurrence of cracks in the AlN layer 3 can be reduced while the thickness of the AlN layer 3 is relatively increased.

A method for fabricating the epitaxial substrate 1 will be described with reference to FIG. 3 below, and then, the epitaxial substrate 1 will be further described. Note that in the following description, the temperature of the single crystal substrate 2 disposed in a reactor of an MOVPE apparatus is referred to as a substrate temperature. The "substrate temperature" may be, but is not limited to, a temperature obtained by measuring, by a thermocouple, the temperature of a susceptor holding the single crystal substrate 2 in the reactor of the MOVPE apparatus.

[1] Step of Pretreating Single Crystal Substrate 2

In this step, the single crystal substrate 2 including the plurality of projections 22 with the plurality of projections 22 protruding from the plane 21 in a normal direction to the plane 21 and arranged in a two-dimensional array is prepared. The single crystal substrate 2 is subsequently subjected to pretreatment with chemicals and pure water, thereby cleaning the plane 21 of the single crystal substrate 2 and an underlying surface 20 including surfaces of the plurality of projections 22. The single crystal substrate 2 is then dried. The sapphire substrate included in the single crystal substrate 2 is a so-called PSS.

[2] Step of Disposing Single Crystal Substrate 2 in Reactor of MOVPE Apparatus

In this step, the single crystal substrate 2 after the pretreatment is disposed in the reactor of the MOVPE apparatus. Specifically, the single crystal substrate 2 is introduced into the reactor of the MOVPE apparatus, the reactor is then vacuumed, and subsequently, a nitrogen gas or the like is caused to flow into the reactor to fill the reactor with the nitrogen gas, which is then removed. Note that the single crystal substrate 2 is preferably a single-crystal wafer which enables a plurality of epitaxial substrates 1 to be formed.

[3] Step of Heating Single Crystal Substrate 2 to Clean Underlying Surface 20 of Single Crystal Substrate 2

In this step, the substrate temperature of the single crystal substrate 2 disposed in the reactor is increased to a prescribed temperature, and heating at the prescribed temperature cleans the underlying surface 20 of the single crystal substrate 2.

More specifically, in this step, the pressure in the reactor is reduced to a prescribed pressure, and then, the substrate temperature is increased to the prescribed temperature while the prescribed pressure in the reactor is kept. Then, heating at the prescribed temperature is performed for a specified time, thereby cleaning the underlying surface 20 of the single crystal substrate 2. The prescribed pressure is, for example, 40 kPa but may accordingly be determined within a range of 1 kPa to 70 kPa. The prescribed temperature is, for example, 1100° C. but may accordingly be determined within a range of 1000° C. to 1200° C. The specified time is, for example, 10 minutes but may accordingly be determined within a range of 5 minutes to 15 minutes. In this step, heating the single crystal substrate 2 with the reactor being supplied with an $H_2$ gas enables the cleaning to be performed effectively.

[4] Step of Forming a Plurality of Island-Shaped AlN Crystal Nuclei 34

In this step, an Al source gas (tri-methyl aluminum: TMAl) and an N source gas (NH$_3$) are fed into the reactor, thereby forming a plurality of island-shaped AlN crystal nuclei 34 (see FIG. 3A) on the underlying surface 20 of the single crystal substrate 2. In this embodiment, the plurality of island-shaped AlN crystal nuclei 34 are parts of the AlN layer 3. The island-shaped AlN crystal nuclei 34 are assumed to function as seed crystals for crystal growth in steps following this step. The plurality of island-shaped AlN crystal nuclei 34 are preferably Al-polar AlN nuclei. This enables growth of N-polar AlN crystals during growth of the second AlN crystals 32 and during growth of the third MN crystal 33 to be suppressed.

This step includes a first process of forming the plurality of island-shaped AlN crystal nuclei 34 and a second process of increasing the size of each of the plurality of island-shaped AlN crystal nuclei 34 formed in the first process.

In the first process, the pressure in the reactor is set to a first prescribed pressure, and the substrate temperature is set to a first predetermined temperature, and in this state, TMAl and NH$_3$ are fed into the reactor to form the island-shaped AlN crystal nuclei 34. As a carrier gas of each of the TMAl and the NH$_3$, an H$_2$ gas is preferably adopted. The first prescribed pressure is, for example, 40 kPa. The first predetermined temperature is stepwise changed, for example, to 1100° C., 1200° C., and 1280° C. in this order. A V/III ratio in the first process is, for example, 8. The "V/III ratio" denotes a ratio of the molar supply volume [μmol/min] of a source gas of N which is a group V element to the molar supply volume [μmol/Ξmin] of a source gas of Al which is a group III element. The V/III ratio in the first process preferably has a value at which the formation of the Al-polar AlN crystal nuclei has a priority over the formation of N-polar AlN crystal nuclei. Moreover, process parameters in the first process are preferably the same as process parameters of a case where when AlN crystal nuclei are grown on a sapphire substrate without projections under the same conditions, the diameter of each AlN crystal nucleus is within a range of 10 nm to 30 nm, the height of each AlN crystal nucleus is within a range of 10 nm to 30 nm, and the number density of the island-shaped AlN crystal nuclei 34 is within a range of about 150/μm$^2$ to 250/μm$^2$. These values are values obtained by observing and evaluating surfaces of samples formed for the evaluation by atomic force microscopy (AFM).

In the second process, the pressure in the reactor is set to a second prescribed pressure, and the substrate temperature is set to a second predetermined temperature, and in this state, TMAl and NH$_3$ are fed into the reactor, thereby increasing the size of each of the island-shaped AlN crystal nuclei 34. As a carrier gas of each of the TMAl and the NH$_3$, an H$_2$ gas is preferably adopted. In the second process, the second prescribed pressure, the second predetermined temperature, and the V/III ratio are preferably determined so as to promote diffusion of Al atoms more than the first process. Thus, it is assumed that the Al atoms can preferentially be attached to the island-shaped AlN crystal nuclei 34. The second prescribed pressure is preferably lower than the first prescribed pressure. The second prescribed pressure is, for example, 20 kPa. The second predetermined temperature is preferably higher than the first predetermined temperature. The second predetermined temperature is, for example, 1350° C. The V/III ratio in the second process is preferably larger than the VIII ratio in the first process. The VIII ratio in the second process is, for example, 106. Process parameters in the second process are preferably the same as process parameters of a case where when AlN crystal nuclei on a sapphire substrate without projections are grown under the same conditions, the diameter of each AlN crystal nucleus 34 is within a range of 20 nm to 50 nm, the height of each island-shaped AlN crystal nucleus 34 is within a range of 20 nm to 40 nm, and the number density of the island-shaped AlN crystal nuclei 34 is within a range of about 150/μm$^2$ to 250/μm$^2$. These values are values obtained by observing and evaluating surfaces of samples formed for the evaluation by AFM.

[5] Step of Forming First AlN crystal 31 and a Plurality of Second AlN Crystals 32 (See FIG. 3B) Each Having Columnar Shape on Underlying Surface 20 of Single Crystal Substrate 2

In this step, an Al source gas (TMAl) and an N source gas (NH$_3$) are fed into the reactor with the pressure in the reactor being kept at a prescribed pressure and the single crystal substrate 2 being heated, thereby causing growth of the first AlN crystal 31 and the plurality of second AlN crystals 32 each having a columnar shape on the underlying surface 20 of the single crystal substrate 2. The prescribed pressure in this step is, for example, 20 kPa. The V/III ratio in this step preferably has a value which promotes vertical direction growth of AlN crystals having facets orthogonal to the normal direction to the plane 21 of the single crystal substrate 2. In other words, the V/III ratio in this step preferably has a value which promotes the growth of the second AlN crystals 32. Thus, the facets of the plurality of second AlN crystals 32 each having a columnar shape are more likely orthogonal to the normal direction to the plane 21 of the single crystal substrate 2, which enables the planarity of the surface of the third AlN crystal 33 to eventually be improved. The V/III ratio in this step is preferably larger than, for example, 51. Specifically, the V/III ratio in this step is preferably within a range of 52 to 140. The term "facet" means a small crystal plane which selectively appears during the crystal growth, and the term "facet" means a plane which is energetically more stable than other crystal planes and on which crystal growth easily occurs. The substrate temperature in this step is preferably higher than 1300° C. and lower than 1390° C.

In this step, a time (growth time) in which an Al source gas and an N source gas are fed into the reactor is preferably a time of a case where when the AlN layer is grown on the c-plane of the sapphire substrate under the same condition, the thickness of the MN layer is larger than or equal to 2 μm. The inventors of the present invention have confirmed that when the growth time is set to a time in which the thickness of the MN layer is 0.2 μm, part of the surface 30 of the MN layer 3 includes a surface of an abnormally grown portion, and the planarity of the surface 30 of the MN layer 3 is degraded. The inventors of the present invention have confirmed based on a cross-sectional SEM image that the abnormally grown portion is an AlN crystal having a columnar shape and not being orthogonal to the normal direction to the plane 21 of the single crystal substrate 2. The method for fabricating the epitaxial substrate 1 can reduce cases where part of the surface 30 of the third MN crystal 33 includes a surface of the abnormally grown portion having a columnar shape and not being orthogonal to the normal direction to the plane 21 of the single crystal substrate 2, and thus the method for fabricating the epitaxial substrate 1 enables the planarity of the surface 30 of the MN layer 3 to be improved. The plurality of second MN crystals 32 each having a columnar shape grow from the respective tips of the plurality of projections 22 of the single crystal substrate 2.

The second AlN crystals 32 are assumed to be AlN crystals having facets orthogonal to the normal direction to the plane 21 of the single crystal substrate 2. In contrast, portions grown from side surfaces except for the tips of surfaces of the plurality of projections 22 of the single crystal substrate 2 are included in the first AlN crystal 31. The first AlN crystal 31 is not a single crystal but is assumed to be a polycrystal. This step preferably adopts only an $H_2$ gas as a carrier gas of the TMAl and only an $H_2$ gas as a carrier gas of the $NH_3$.

[6] Step of Forming Third AlN Crystal 33 (see FIG. 3C)

In this step, an Al source gas (TMAl) and an N source gas ($NH_3$) are fed into the reactor with the pressure in the reactor being kept at a prescribed pressure and the single crystal substrate 2 being heated, thereby forming the second AlN crystals 32 and the third AlN crystal 33. The surface 330 of the third AlN crystal 33 is included in the surface 30 of the AlN layer 3. The prescribed pressure in this step is, for example, 20 kPa. The V/III ratio in this step preferably has a value at which lateral growth of the AlN crystal is promoted. This can reduce the distance between the third AlN crystal 33 and the single crystal substrate 2 and can further reduce the thickness of the AlN layer 3. The V/III ratio in the step is preferably smaller than, for example, 51 and is preferably within a range of 4 to 50. The substrate temperature in this step is preferably higher than 1300° C. and lower than 1390° C. The growth time of the third AlN crystal 33 may be, but is not limited to, a time in which when an AlN crystal is grown on a sapphire substrate with a plane under the same growth condition as the third AlN crystal 33, the thickness of the AlN crystal is 10 µm. This step preferably adopts only an $H_2$ gas as a carrier gas of the TMAl and only an $H_7$ gas as a carrier gas of the $NH_3$. Thus, in this step, the lateral growth of the AlN crystal can be promoted more than in a case where at least one of the carrier gas of the TMAl and the carrier gas of the $NH_3$ is an $N_2$ gas or a mixed gas of an $N_2$ gas and an $H_2$ gas. Thus, the planarity of the surface 30 of the AlN layer 3 can be improved. In this step, eliminating the $N_2$ gas from the carrier gas fed into the reactor enables the thickness of the third AlN crystal 33, which is required for planarization of the surface 30 of the AlN layer 3, to be further reduced. Thus, in the method for fabricating the epitaxial substrate 1, the yield can be increased and the cost can be reduced. In the third step, the AlN crystal is easily grown in lateral directions along the $a_1$, $a_2$, and $a_3$ axes. As a result, the third step enables each two adjacent second AlN crystals 32 of the plurality of second AlN crystals 32 to be connected above the hollow 37 without excessively increasing the thickness of the third AlN crystal 33.

After the steps described in [1] to [6] end, the substrate temperature is lowered to, for example, about room temperature, and then the epitaxial substrate 1 is taken out of the MOVPE apparatus. The epitaxial substrate 1 taken out of the MOVPE apparatus may be stored in a state as the epitaxial substrate 1 or may be utilized as a template substrate for growth of a group III nitride semiconductor layer with a crystal growth apparatus other than the MOVPE apparatus. The crystal growth apparatus mentioned here is, for example, a molecular beam epitaxy (MBE) apparatus. Moreover, when the epitaxial substrate 1 fabricated with the MOVPE apparatus is immediately provided for fabrication of a nitride semiconductor element, the epitaxial substrate 1 is not taken out of the MOVPE apparatus, and the group III nitride semiconductor layer is grown on the epitaxial substrate 1. Then, the substrate temperature is lowered to about the room temperature, and the epitaxial substrate 1 on which the group III nitride semiconductor layer is grown is taken out of the MOVPE apparatus.

As illustrated in FIG. 1, the epitaxial substrate 1 described above includes a first AlN crystal 31, a plurality of second AlN crystals 32, and a third AlN crystal 33. The first AlN crystal 31 covers the plane 21 and the plurality of projections 22 with tips of the plurality of projections 22 being exposed. The plurality of second AlN crystals 32 protrude from the tips of the plurality of projections 22 along the normal direction to the plane 21. Each second AlN crystal 32 has a shape of a column whose cross-sectional area increases as the distance from a tip of an associated one of the plurality of projections 22 increases. The third AlN crystal 33 is formed as a layer interconnecting ends 322 of the plurality of second AlN crystals 32. The ends 322 are located opposite the single crystal substrate 2. Thus, in the epitaxial substrate 1, the dislocation density can be reduced while crystallinity can be improved.

The epitaxial substrate 1 may be utilized as a template substrate for growth of a crystal layer of, for example, a nitride semiconductor element. In this embodiment, the AlN layer 3 of the epitaxial substrate 1 may serve as a buffer layer of, for example, a light-emitting element (e.g., light-emitting diode, laser diode). When the AlN layer 3 of the epitaxial substrate 1 is utilized as the buffer layer of the light-emitting element, the AlN layer 3 is formed on the single crystal substrate 2 disposed in the reactor of the MOVPE apparatus (i.e., the epitaxial substrate 1 is formed), and then the AlN layer 3 may be used as a buffer layer to sequentially grow, for example, an n-type AlGaN layer, a light emitting layer, an electron blocking layer, and a p-type AlGaN layer. In this case, in the light-emitting element, the crystallinity of each of the n-type AlGaN layer, the light emitting layer, the electron blocking layer, and the p-type AlGaN layer can be increased more than in a case where an epitaxial substrate in a second comparative example is adopted as the epitaxial substrate 1. The light-emitting element enables light (e.g., ultraviolet radiation) emitted from the light emitting layer to be output from the second surface 202 of the single crystal substrate 2.

The single crystal substrate 2 is not limited to the sapphire substrate but may be, for example, a SiC substrate, an AlN substrate, or a GaN substrate as long as it is a single crystal substrate having a hexagonal crystal structure. In other words, in the epitaxial substrate 1, the single crystal substrate 2 is preferably a sapphire substrate, a SiC substrate, an AlN substrate, or a GaN substrate. In this embodiment, the crystal axis in the normal direction to the plane 21 of the single crystal substrate 2 is preferably the c axis. Thus, the epitaxial substrate 1 enables the crystallinity of the AlN layer 3 to be further improved.

An epitaxial substrate 1 of an example will be described below.

The configuration of the epitaxial substrate 1 in the example is similar to that of the epitaxial substrate 1 of the embodiment. A single crystal substrate 2 of the epitaxial substrate 1 is a sapphire substrate, more specifically, a so-called PSS. In this example, a single crystal substrate 2 has a plane 21 which is substantially the (0001) plane. The plane 21 of the single crystal substrate 2 has an off-angle of 0.2°±0.1° from the (0001) plane. The single crystal substrate 2 has projections 22 each having a conical shape. Each projection 22 has a height of 600 nm. Moreover, each projection 22 has a bottom surface having a diameter of 900 nm. Furthermore, the distance between each adjacent projections 22 of the plurality of projections 22 is 100 nm.

The epitaxial substrate 1 in the example is a substrate having the structure of epitaxial growth of an AlN layer 3 on the single crystal substrate 2 based on the method for fabricating the epitaxial substrate 1 of the embodiment. More specifically, the epitaxial substrate 1 in the example is a substrate formed by epitaxial growth of the AlN layer 3 on the single crystal substrate 2 in a reactor of a MOVPE apparatus according to the growth sequence shown in FIG. 4.

In a first process of a first step, the pressure in the reactor was set to 40 kPa, and the substrate temperature was set to 1100° C., and in this state, TMAl and NH$_3$ were fed into the reactor for only 4.5 seconds so as to achieve a V/III ratio of 8. Then, the substrate temperature was increased to 1200° C., and in this state, TMAl and NH$_3$ were fed into the reactor for only 3 seconds so as to achieve a V/III ratio of 8. Thereafter, the substrate temperature was increased to 1280° C., and in this state, TMAl and NH$_3$ were fed into the reactor for only 3 seconds so as to achieve a V/III ratio of 8. In a second process of the first step, the pressure in the reactor was set to 20 kPa and the substrate temperature was set to 1350° C., and in this state, TMAl and NH$_3$ were fed into the reactor for only 3 seconds so as to achieve a V/III ratio of 106. In the first step, an H$_2$ gas was adopted as a carrier gas of each of the TMAl and the NH$_3$.

In a second step, the pressure in the reactor was set to 20 kPa and the substrate temperature was set to 1350° C., and in this state, TMAl and NH$_3$ were fed into the reactor so as to achieve a V/III ratio of 140. In the second step, the growth time was determined based on the growth rate of AlN under the same condition without the projections 22 such that the thickness of the AlN is 2 μm. In the second step, an H$_2$ gas was adopted as a carrier gas of each of the TMAl and the NH$_3$.

In a third step, the pressure in the reactor was set to 20 kPa and the substrate temperature was set to 1350° C., and in this state, TMAl and NH$_3$ were fed into the reactor so as to achieve a V/III ratio of 4. In the third step, the growth time was determined based on the growth rate of AlN under the same condition without the projections 22 such that the thickness of the AlN is 10 μm. In the third step, an H$_2$ gas was adopted as a carrier gas of each of the TMAl and the NH$_3$.

The crystallinity of the epitaxial substrate 1 in the example was evaluated based on the surface morphology of the AlN layer 3, the dislocation density in the AlN layer 3, and the like. The dislocation density mentioned herein denotes the density of dislocations including edge dislocations, screw dislocations, and mixed dislocations (the dislocation consists mostly of the edge dislocation). In other words, the dislocation density mentioned herein denotes a value obtained by collectively calculating the edge dislocation, the screw dislocation, and the mixed dislocation without distinguishing them from one another. The dislocation density is a value calculated from a cross-sectional TEM image.

Figure 5:
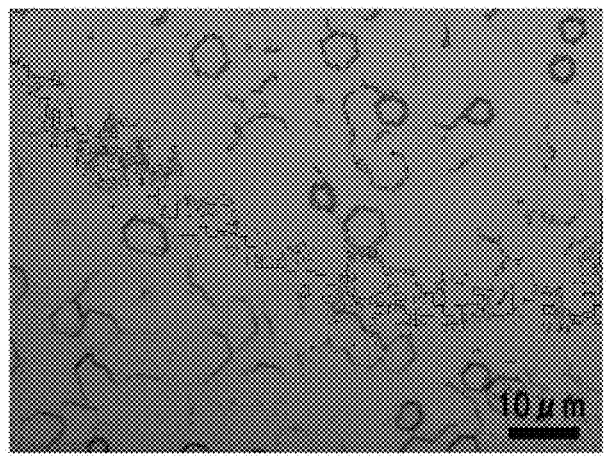
FIG. 5 is an optical micrograph of a surface of the epitaxial substrate in the example of the present invention.
Figure 6:
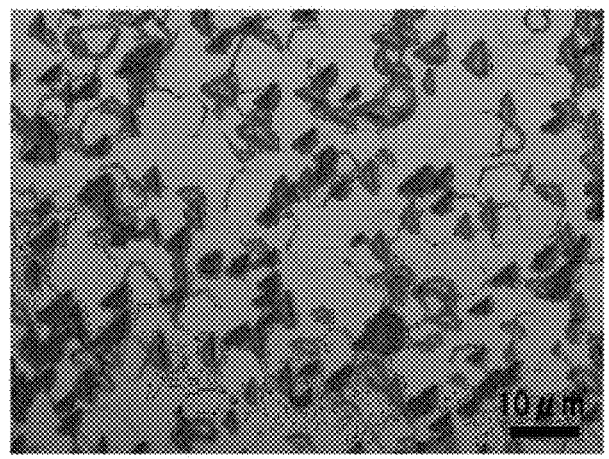
FIG. 6 is an optical micrograph of a surface of an epitaxial substrate in a first comparative example.

FIG. 5 shows an optical micrograph of a surface 30 of the AlN layer 3 of the epitaxial substrate 1 in the example observed by an optical microscope. FIG. 6 shows an optical micrograph of a surface of the AlN layer of an epitaxial substrate in a first comparative example observed by an optical microscope. A method for fabricating the epitaxial substrate in the first comparative example is similar to the method for fabricating the epitaxial substrate in the example. The method for fabricating the epitaxial substrate in the first comparative example is different from the method for fabricating the epitaxial substrate 1 in the example in that in the second step, the growth time was determined based on the growth rate of MN under the same condition without the projections 22 such that the thickness of the AlN is 0.2 μm. Moreover, the method for fabricating the epitaxial substrate in the first comparative example is different from the method for fabricating the epitaxial substrate in the example in that in the third step, the growth time is set based on the growth rate of AlN under the same condition without the projections 22 such that the thickness of the AlN is 11.8 μm. From FIGS. 5 and 6, it can be seen that the planarity of the surface is improved more in the epitaxial substrate 1 in the example than in the epitaxial substrate in the first comparative example.

The dislocation density of the AlN layer in the epitaxial substrate in the second comparative example was $2.0 \times 10^9$ cm$^{-2}$. In the second comparative example, the AlN layer was grown on a single crystal substrate having a plane without projections under the same condition as the example. Moreover, the dislocation density of the MN layer on the NPSS described in Non-Patent Literature 1 was substantially $1.2 \times 10^9$ cm$^{-2}$. In contrast, the dislocation density of the AlN layer 3 of the epitaxial substrate 1 in the example is $6.2 \times 10^8$ cm$^{-2}$ and is lower than each of the dislocation density of the AlN layer of the epitaxial substrate in the second comparative example and the dislocation density (about $1.2 \times 10^9$ cm$^{-2}$) of the AlN layer on the NPSS described in Non-Patent Literature 1. Thus, in the epitaxial substrate 1 in the example, the crystallinity of the AlN layer 3 is assumed to be improved. The dislocation density of the AlN layer 3 or the epitaxial substrate 1 in the example has a value calculated from a cross-sectional TEM image.

Figure 7:
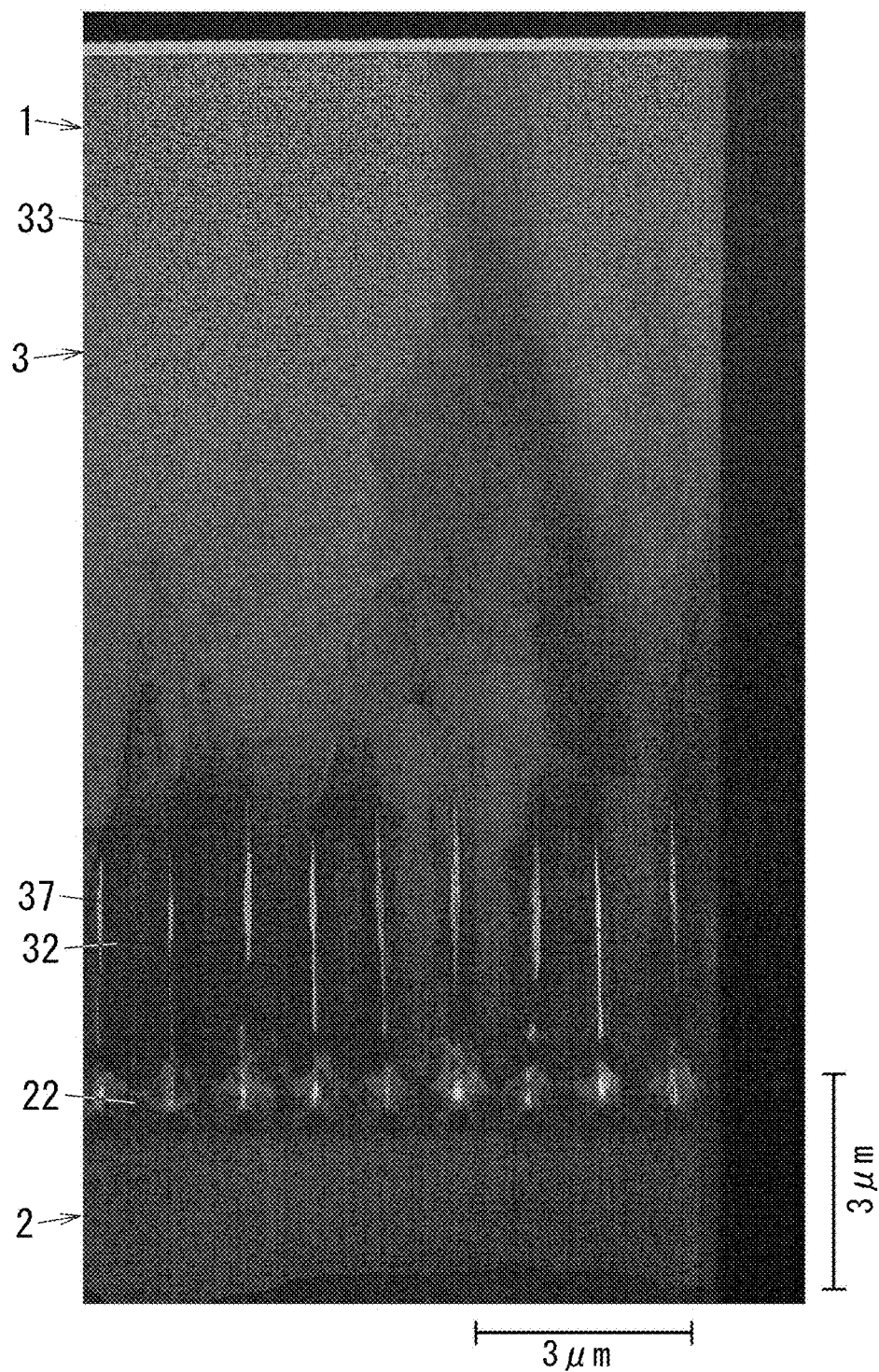
FIG. 7 is a cross-sectional transmission electron microscope (TEM) image of the epitaxial substrate according to the example of the present invention.
Figure 8:
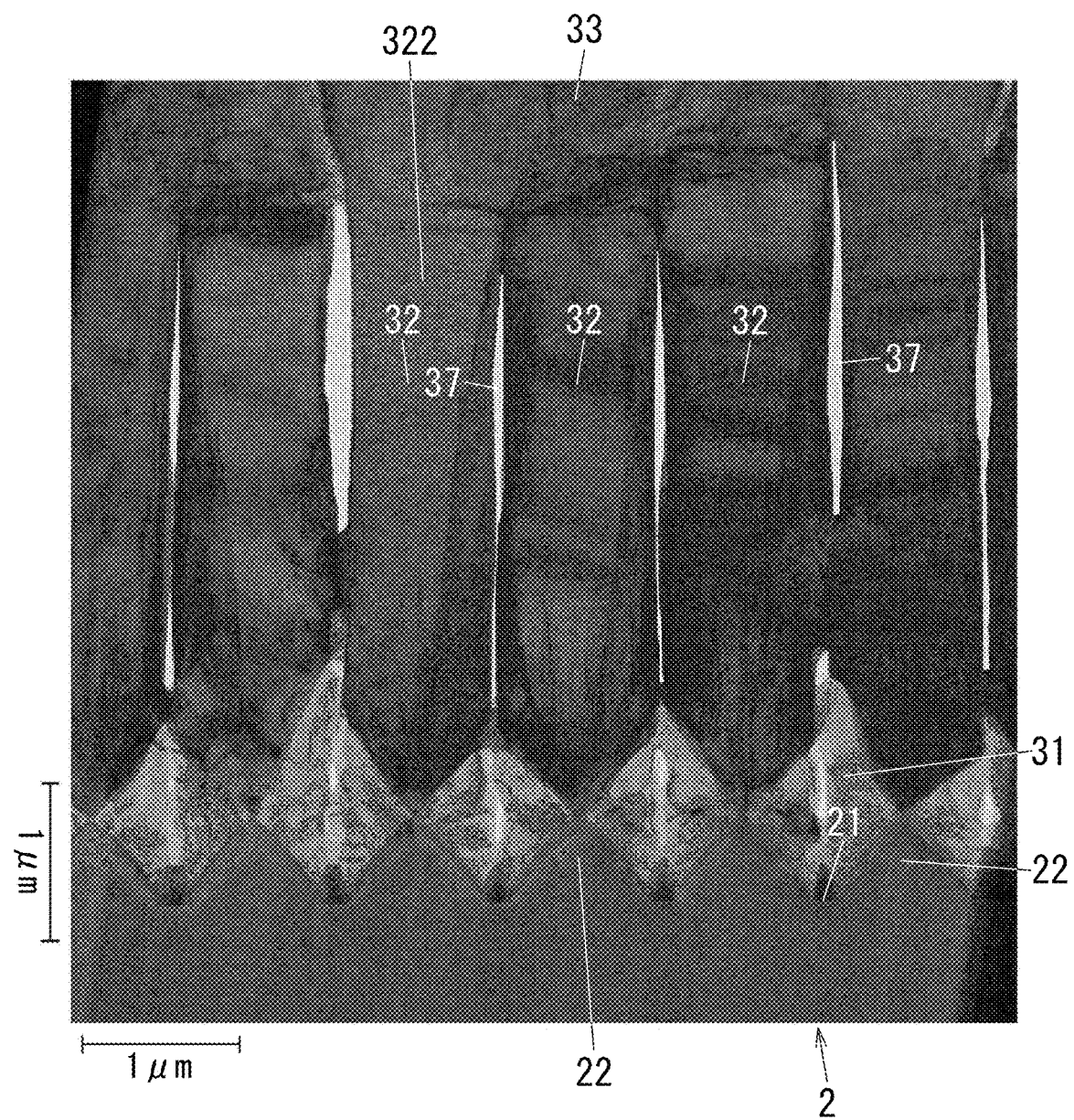
FIG. 8 is an enlarged view illustrating a main part of FIG. 7.

FIGS. 7 and 8 show cross-sectional TEM images of the epitaxial substrate 1 in the example. From FIGS. 7 and 8, it is confirmed that in the epitaxial substrate 1 in the example, a dislocation extending from a periphery of a tip of the projection 22 in a direction inclined from the normal direction to the single crystal substrate 2 disappears at the hollow 37, and dislocations in the third AlN crystal 33 are reduced.

The materials, numerical values, and the like described in the embodiment and the examples are merely preferable examples, and the inventors do not intend to limit the present invention to these examples. Moreover, the configuration of the present invention may accordingly be modified without departing from the technical idea of the present invention.

Note that the MN layer 3 may contain impurities such as H, C, O, Si, and Fe which inevitably contained during the growth of the AlN layer 3. Moreover, the AlN layer 3 may contain impurities such as Si, Ge, Be, Mg, Zn, and C intentionally introduced to control conductivity during the growth of the AlN layer 3.

REFERENCE SIGNS LIST

1 Epitaxial Substrate
2 Single Crystal Substrate
21 Plane
22 Projection
3 MN Layer
31 First AlN Crystal
32 Second AlN Crystal
322 End
33 Third AlN Crystal
37 Hollow

The invention claimed is:

1. An epitaxial substrate, comprising:
a single crystal substrate including a plurality of projections with the plurality of projections protruding from a plane in a normal direction to the plane and arranged in a two-dimensional array; and an AlN layer on the plane of the single crystal substrate, each of the plurality of projections having a conical or pyramidal shape tapered in the normal direction, the AlN layer including:

a first AlN crystal covering the plane and the plurality of projections with tips of the plurality of projections being exposed;

a plurality of second AlN crystals directly protruding from the tips of the plurality of projections along the normal direction and each having a shape of a column whose cross-sectional area of an end adjacent to the single crystal substrate increases as a distance from a tip of an associated one of the plurality of projections increases; and a third AlN crystal formed as a layer interconnecting ends of the plurality of second AlN crystals, the ends being located opposite the single crystal substrate.

2. The epitaxial substrate according to claim 1, wherein a hollow is provided between each adjacent two of the plurality of second AlN crystals.

3. The epitaxial substrate according to claim 1, wherein, the single crystal substrate is a sapphire substrate, a SiC substrate, an AlN substrate, or a GaN substrate, and a crystal axis of the single crystal substrate in the normal direction is a c axis.

4. The epitaxial substrate according to claim 2, wherein, the single crystal substrate is a sapphire substrate, a SiC substrate, an AlN substrate, or a GaN substrate, and a crystal axis of the single crystal substrate in the normal direction is a c axis.

* * * * *